(12) United States Patent
Asbeck et al.

(10) Patent No.: US 8,148,718 B2
(45) Date of Patent: Apr. 3, 2012

(54) LOW VOLTAGE TRANSISTORS

(75) Inventors: Peter Asbeck, Del Mar, CA (US); Lingquan Wang, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/156,547

(22) Filed: Jun. 2, 2008

(65) Prior Publication Data

US 2009/0072270 A1 Mar. 19, 2009

Related U.S. Application Data

(60) Provisional application No. 60/932,535, filed on May 31, 2007.

(51) Int. Cl.
*H01L 29/15* (2006.01)
(52) U.S. Cl. ... 257/27; 257/192; 257/200; 257/E49.001; 257/E29.081; 257/E29.091
(58) Field of Classification Search .................. 257/200, 257/27, 192, E49.001, E29.081, E29.091, 257/E29.242
See application file for complete search history.

(56) References Cited

U.S. PATENT DOCUMENTS

| | | | |
|---|---|---|---|
| 5,270,798 A * | 12/1993 | Pao et al. | 257/134 |
| 5,410,160 A * | 4/1995 | Goronkin et al. | 257/15 |
| 5,567,961 A | 10/1996 | Usagawa et al. | |
| 5,825,063 A | 10/1998 | Diorio et al. | |
| 5,969,378 A | 10/1999 | Singh | |
| 6,891,234 B1 | 5/2005 | Connelly et al. | |
| 2004/0099966 A1 * | 5/2004 | Chau et al. | 257/916 |
| 2006/0060871 A1 * | 3/2006 | Beach | 257/94 |
| 2007/0178650 A1 * | 8/2007 | Chen et al. | 438/301 |

OTHER PUBLICATIONS

Coulomn Blockade Observed in InAs/AlGaSb Nanostructures Produced by an Atomic Force Microscope Oxidation Process. Journal of Applied Physics vol. 38 (1999) pp. 480-482. Sasa et al.*
Hudai, M., et. al., , "Heterogeneous Integration of Enhancement Mode In0.7Ga0.3 As Quantum Well Transistor on Silicon Substrate Using Thin Composite Buffer Architecture for High-Speed and Low-Voltage (0.5V) Logic Applications," Tech. Dig. 2007 IEDM, pp. 625-628.
Bennett BR, Shanabrook BV. "Molecular beam epitaxy of Sb based semiconductors," In: Liu Awk, Santos MB, editors. Thin films: heteroepitaxial systems. Singapore: World Scientific; 1999. pp. 401-452.
Appenzeller, J. et al., "Comparing Carbon Nanotube Transistors—The Ideal Choice: A Novel Tunneling Device Design", IEEE Trans. Electr. Dev. 52, 2568-2576 (2005).
Bryllert, T. et al., "Vertical high mobility wrap-gated InAs nanowire transistor", 2005 Device Research Conference Digest, pp. 157-158.
Passlack, M. et al., "High Mobility NMOSFET Structure With High-k Dielectric", IEEE Electron Device Letters, 26, 713-715 (2005).

(Continued)

*Primary Examiner* — Tom Thomas
*Assistant Examiner* — Christopher M Roland
(74) *Attorney, Agent, or Firm* — Greer, Burns & Crain Ltd.

(57) ABSTRACT

The invention provides a transistor having a substrate, a structure supported by the substrate including a source, drain, gate, and channel, wherein the source and the channel are made of different materials, and a tunnel junction formed between the source and the channel, whereby the tunnel junction is configured for injecting carriers from the source to the channel.

22 Claims, 6 Drawing Sheets

OTHER PUBLICATIONS

Jackson, E.M. et al., "Arsenic cross-contamination in GaSb/InAs superlattices" J. Crystal Growth 270, 301-308 (2004).

Yu, E.T. et al., "Demonstration of resonant transmission in InAS/GaSb/InAs interband tunneling devices", Appl. Phys. Lett. 57, 2675-2677 (1990).

Dayeh SA, Soci C, Yu PKL Yu ET, Deli Wang. Transport properties of InAs nanowire field effect transistors: the effects of surface states. *Journal of Vacuum Science & Technology B (Microelectronics and Nanometer Structures)*, vol. 25, No. 4, Jul. 2007, pp. 1432-1436.

Zhou X, Dayeh SA, Wang D, Yu ET. Analysis of local carrier modulation in InAs semiconductor nanowire transistors. *I Journal of Vacuum Science & Technology B (Microelectronics and Nanometer Structures)*, vol. 25, No. 4, Jul. 2007, pp. 1427-1431.

Zhou X, Dayeh SA, Wang D, Yu ET. Scanning gate microscopy of InAs nanowires. *Applied Physics Letters*, vol. 90, No. 23, Jun. 4, 2007, pp. 233118/1-233118/3.

Dayeh SA, Aplin DPR, Zhou X, Yu PKL, Yu ET, Wang D. High electron mobility InAs nanowire field-effect transistors. *Small*, vol. 3, No. 2, Feb. 2007, pp. 326-332.

Dayeh SA, Soci C, Yu PKL, Yu ET, Deli Wang. Influence of surface states on the extraction of transport parameters from InAs nanowire field effect transistors, *Applied Physics Letters*, vol. 90, No. 16, Apr. 16, 2007, pp. 162112-1-162112-3.

Zhou X, Dayeh SA, Aplin D, Wang D, Yu ET. Scanned electrical probe characterization of carrier transport behavior in InAs nanowires. *Journal of Vacuum Science & Technology B (Microelectronics and Nanometer Structures)*, vol. 24, No. 4, Jul. 2006, pp. 2036-2040.

Thou X, Dayeh SA, Aplin D, Wang D, Yu ET. Direct observation of ballistic and drift carrier transport regimes in InAs nanowires. *Applied Physics Letters*, vol. 89, No. 5, Jul. 31, 2006, pp. 53113-1-53113-3.

SA Dayeh, ET Yu, D Wang, "Growth of InAs Nanowires on SiO2 Substrates: Nucleation, Evolution and the role of Au Nanoparticles", J. Phys. Chem, 2007—111, 13331.

SA Dayeh, ET Yu, D Wang, III-V Nanowire Growth Mechanism: V/III Ratio and Temperature Effects,—Nano Lett, vol. 7, No. 8, 2486 (2007).

SA Dayeh, ET Yu, D Wang, "Excess Indium and Substrate Effects on the Growth of InAs Nanowires", Small, vol. 3, No. 10, p. 1683.

Lingquan Wang, Deli Wang, Asbeck PM. "A numerical Schrodinger-Poisson solver for radially symmetric nanowire core-shell structures." *Solid-State Electronics*, vol. 50, No. 11-12, Nov.-Dec. 2006, pp. 1732-1739.

Lingquan Wang, P M Asbeck, "Analysis of Photoelectronic Response in Semiconductor Nanowires", Tech. Dig. IEEE Nanotechnology Conf. vol. 2, p. 716-719 (2006).

Y. Taur, "CMOS design near the limit of scaling", IBM Journal of Research and Development, vol. 46, 2002, pp. 213-222.

R. Chau, S. Datta, and A. Majumdar, "Opportunities and Challenges of III-V Nanoelectronics for Future High-Speed, Low-Power Logic Applications", Tech. Dig., 2005 Compound Semiconductor IC Symposium, p. 17.

Q. Zhang, W, Zhao, and A.Seabaugh, "Low-subthreshold-swing tunnel transistors", IEEE Electron Device Letters, IEEE Apr. 2006 vol. 27, Issue: 4 pp. 297-300.

Steep, Program sponsored by Defence Advanced Research Projects Agency (DARPA) http://www.darpa.mil/MTO/programs/steep/index.html.

Woo Young Choi; Byung-Gook Park; Jong Duk Lee; Tsu-Jae King Liu, "Tunneling Field-Effect Transistors (TFETs) With Subthreshold Swing (SS) Less Than 60 mV/dec", IEEE EDL vol. 28, Aug. 2007, pp. 743-745.

Th. Nirschl, St. Henzler, J. Fischer M. Fulder, Bargagli-Stoffi, M. Sterkela, J. Sedlmeir, C. Weber, R. Heinrich, U. Schaper, J. Einfeld, R. Neubert, U. Feldmann,K. Stahrenberg, E. Ruderer, G. Georgakos, A. Huber, R. Kakoschke, W. Hansch and D. Schmitt-Landsiedel "Scaling properties of the tunneling field effect transistor (TFET): Device and circuit" Solid-State Electronics, vol. 50 (1), Jan. 2006, pp. 44-51.

J. Appenzeller, Y.-M. Lin, J. Knoch, and Ph. Avouris, "Band-to-Band Tunneling in Carbon Nanotube Field-Effect Transistors", Physics Review Letter, vol. 93, Nov. 2004.

K. Bhuwalka, S. Sedlmaier, A. Ludsteck, C. Tolksdorf, J. Schulze, and I. Eisele, "Vertical Tunnel Field-Effect Transistor", IEEE Trans. Electr. Dev. 51, No. 2, Feb. (2004) 279.

M. Passlack, P. Zurcher, K. Rajagopalan, R. Droopad, J. Abrokwah, M. Tutt, Y.-B. Park, E. Johnson,0. Hartin, A. Zlotnicka, P. Fejes, R.J.W. Hill, D.A.J. Moran, X. Li, H. Zhou, D. Macintyre, S. Thoms, A. Asenov, K. Kalna, and I.G. Thayne, "High Mobility III-V MOSFETs For RF and Digital Applications", Tech. Dig. 2007 IEDM, p. 621.

P. D. Ye, G. D. Wilk, J. Kwo, B. Yang, H.-J. L. Gossmann, M. Frei, S. N. G. M. Hong, K. K. Ng, and J. Bude, "GaAs MOSFET With Oxide Gate Grown by Atomic Layer Deposition", IEEE Electr. Dev. Lett. 24, (4), Apr. 2003, p. 209.

Y. Xuan, Y.Q. Wu, T. Shen, T. Yang and P.D. Ye, "High Performance submicron inversion-type enhancement-mode InGaAs MOSFETs with ALD Al2O3, HfO2, and HfAIO as gate dielectrics", IEDM 2007, pp. 637-640.

K. Ma, R. Urata, D. A. B. Miller, J. S. Harris, "Low-temperature growth of GaAs on Si used for ultrafast photoconductive switches," IEEE J. Quantum Electron. 40 (6), pp. 800-805, Jun. 2004.

Fischetti, M. V.; Wang, L.; Yu, B.; Sachs, C.; Asbeck, P. M.; Taur Y.; Rodwell, M., "Simulation of Electron Transport in High-Mobility MOSFETs: Density of States Bottleneck and Source Starvation", pp. 109-112.

Brian R. Bennett, Richard Magno, J. Brad Boos, Walter Kruppa and Mario G. Ancona, "Antimonide-based compound semiconductors for electronic devices: A review", Solid State Electronics, vol. 49, Dec. 2005, pp. 1875-1895.

H. Kroemer, "The 6.1 Å family (InAs, GaSb, AISb) and its heterostructures: a selective review", Physica E: Low-dimensional Systems and Nanostructures, vol. 20, Jan. 2004, pp. 196-203.

William R. Deal, Roger Tsai, Michael D. Lange, J. Brad Boos, Brian R. Bennett, and Augustc Gutierrez, "A W-Band InAs/AISb Low-Noise/Low-Power Amplifier", IEEE Microwave and Wireless Components Letters, Jan. 2005, pp. 1-3.

Brian R. Bennett, Mario G. Ancona, J. Brad Boos, and Benjamin V. Shanabrook, "Mobility enhancement in strained p-InGaSb quantum wells", Appl. Phys. Lett. 91, 042104 (2007).

G Edwards and J C lnkson, "A microscopic calculation for hole tunnelling in type-II InAs/GaSb structures", Semicond. Sci. Technol. 9 (1994) 178-184.

D.Z.-Y.Ting, E.T.Yu, D.A.Collins, D.H.Chow and T.C.McGill, "Modeling of novel heterojunction tunnel structures", J. Vac. Sci. Technol. B. vol. 8, No. 4 , 810 (1990).

D.Z.-Y.Ting, E.T.Yu and T.C.McGill, "Multiband treatment of quantum transport in interband tunnel devices", Physical Review B, vol. 45, Feb. 1992, pp. 3583-3592.

Chang CA, Ludeke R, Chang LL, Esaki L. "Molecular-beam epitaxy(MBE) of InGaAs and GaSbAs", Appl Phys Lett 1977;31(11):759-761.

H. Zhang and E. T. Yu, "Demonstration and analysis of reduced reverse bias leakage current via design of nitride semiconductor heterostructures grown by molecular beam epitaxy," *J. Appl. Phys.* 99, 014501-1-6 (2006).

H. Zhang, E. J. Miller, and E. T. Yu, "Analysis of leakage current mechanisms in Schottky contacts to GaN and $Al_{0.25}Ga_{0.75}N$/GaN grown by molecular-beam epitaxy," *J. Appl. Phys.* 99, 023703-1-6 (2006).

S. H. Lim, W. Mar, P. Matheu, D. Derkacs, and E. T. Yu, "Photocurrent spectroscopy of optical absorption enhancement in silicon photodiodes via scattering from surface plasmon polaritons in gold nanoparticles," *J. Appl. Phys.* 101, 104309-1-7 (2007).S. A. Dayeh, E. T. Yu, and D. Wang, "III-V nanowire growth mechanism: V/III ratio and temperature effects," *Nano Lett.* 7, 2486-90 (2007).

D. Derkacs, S. H. Lim, P. Matheu, W. Mar, and E. T. Yu, "Improved performance of amorphous silicon solar cells via scattering from surface plasmon polaritons in nearby metallic nanoparticles," *Appl. Phys. Lett.* 89, 093103.1-3 (2006).

X. Zhou, S. A. Dayeh, D. Aplin, D. Wang, and E. T. Yu, "Direct observation of ballistic and drift carrier transport regimes in InAs nanowires," *Appl. Phys. Lett.* 89, 053113-1-3 (2006).

S. Raychaudhuri and E. T. Yu, "Critical dimensions in coherently strained coaxial nanowire heterostructures," *J. Appl. Phys.* 99, 114308-1-7 (2006).

D. M. Schaadt, B. Feng, and E. T. Yu, "Enhanced semiconductor optical absorption via surface plasmon excitation in metal nanoparticles," *Appl. Phys. Lett.* 86, 063106-1-3 (2005).

P.-F.Wang, K Hilsenbeck, T. Nirschl, M. Oswald, C. Stepper, M. Weis, D. Schmitt-Landsiedel, W. Hansch, "Complementary Tunneling Transistor for Low Power Application", Solid-State Electronics, 48, 2281 (2004).

J.Appenzeller,.Y.-M. Lin.J. Knoch, Z. Chen and P. Avourls, "Comparing Carbon Nanotube Transistors—The Idea Choice: A Novel Tunneling Device Design", IEEE Trans. Elect. Dev. 52, 2568 (2005).

E.T.Yu, D.A.Collins, D. Z.-Y. Ting, D.H.Chow and T.C. McGill, "Demonstration of Resonant Transmission in InAs/GaSb/InAs Interband Tunneling Devices", Appl. Phys. Lett 57, 2677 (1990).

R. Magri et al., J. Appl.Phys. 98, 043701 (2005). Evolution of the band-gap and band-edge energies of the lattice-matched GaInAsSb/GaSb and GaInAsSb/InAs alloys as a function of composition.

international Search Report and Written Opinion of the International Searching Authority. mailed Jan. 23, 2009, relating to the co-pending PCT Application No. PCT/IB2008/001690.

* cited by examiner

LOW VOLTAGE TRANSISTORS

PRIORITY CLAIM AND REFERENCE TO RELATED APPLICATION

The application claims priority under 35 U.S.C. §119 from prior provisional application Ser. No. 60/932,535, which was filed May 31, 2007.

FIELD

The field of the invention is semiconductor devices.

BACKGROUND

A critical issue for scaled logic devices is the ability to operate with reduced power supply voltages, both in order to reduce power dissipation and in order to mitigate high electric field related problems. The subthreshold swing of present metal oxide semiconductor (MOS) devices (at best 60 mV/decade), and the resultant leakage current, is a major impediment to further scaling of power supply voltage.

Some proposed low subthreshold swing devices are based on tunneling MOSFETs, including structures based on Si and others based on carbon nanotubes. Mosfets based on nanowires and related geometries have also been discussed. See, e.g., P.-F. Wang, et al, "Complementary Tunneling Transistor for Low Power Application," Solid-State Electronics, 48, 2281 (2004); J. Appenzeller et al, "Comparing Carbon Nanotube Transistors—The Ideal Choice: A Novel Tunneling Device Design." IEEE Trans. Electr. Dev. 52, 2568 (2005). Interband tunneling devices with GaSb and InAs and related materials have also been used, particularly for resonant tunnel diodes (RTDs). Yu, et al, "Demonstration of Resonant Transmission in InAs/GaSb/InAs Interband Tunneling Devices," Appl. Phys. Lett. 57, 2677 (1990).

SUMMARY OF THE INVENTION

The invention provides a transistor having a substrate, a structure supported by the substrate including a source, drain, gate, and channel, wherein the source and the channel are made of different materials, and a tunnel junction formed between the source and the channel, whereby the tunnel junction is configured for injecting carriers from the source to the channel. The materials used in the source and the channel are different, and are chosen in order to optimize the tunneling current.

DETAILED DESCRIPTION OF THE PREFERRED EMBODIMENTS

Figure 1:
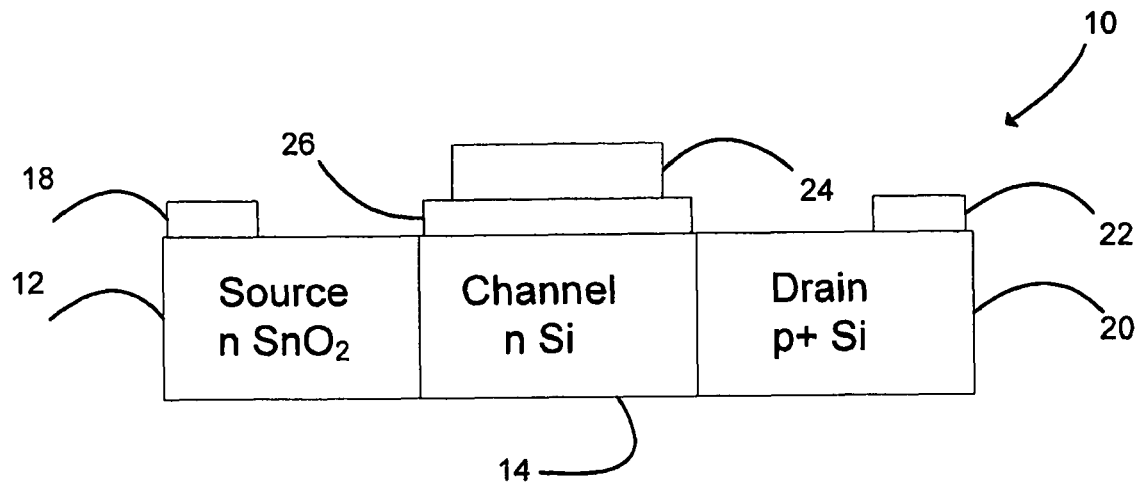
FIG. 1 is a conceptual diagram of a silicon based transistor of the invention.

The invention provides very low power transistors that can be operated from a 0.3 volt or lower power supply and have thresholds as low as 0.1-0.2 volts or lower, and yet do not suffer from large leakage currents in the OFF state. This represents ⅓ the supply voltage typically utilized by modern logic transistors. Such a significant voltage reduction offers the potential for a great reduction in power consumption. Reduced power consumption is especially beneficial for portable devices that make use of exhaustible or rechargeable power supplies, e.g., batteries. Reduced voltage levels are also beneficial for reducing heat generation and reducing potential interference effects between devices and interconnections between devices.

Embodiments of the invention provide very low voltage Si or Ge transistors. Other embodiments of the invention provide low voltage Group III-V transistors. The transistors of the invention are also able to turn on and off with only a small input voltage. In particular, the invention provides field effect transistors that achieve subthreshold swing lower than 60 mV/decade (which is the typical limit for conventional transistors). At the same time, transistors of the invention are capable of operation at high speeds.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Figure 2:
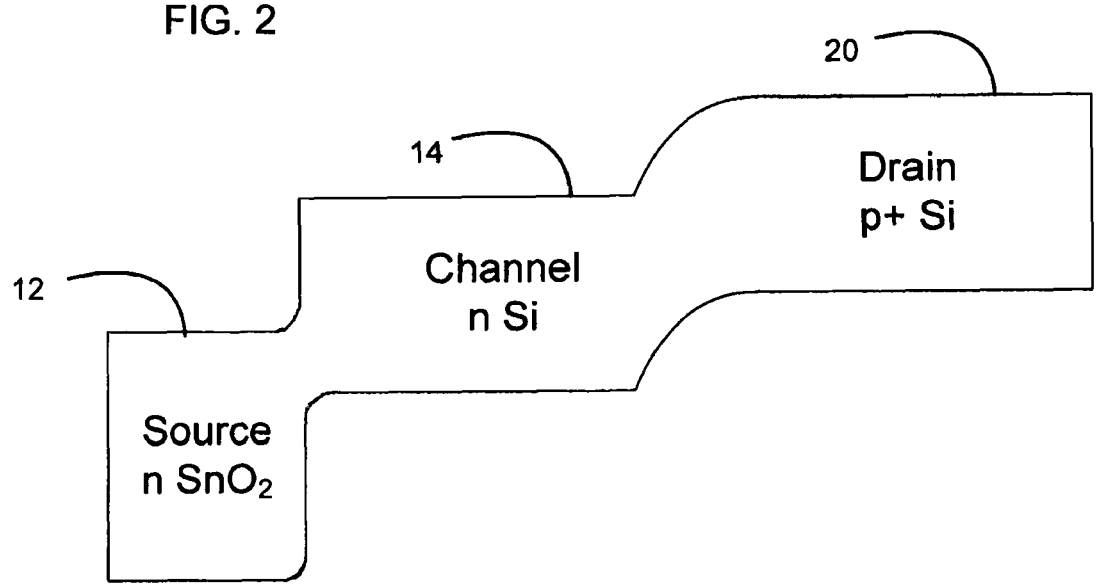
FIG. 2 is a band diagram of the FIG. 1 transistor.

Referring now to FIG. 1, a conceptual diagram of an Si-based transistor 10 of the invention is shown, and the corresponding approximate band diagram along channel for zero bias condition is shown in FIG. 2. The transistor 10 is implemented with a heterojunction between a source 12, e.g., n-type $SnO_2$, and a channel 14, e.g., n-type Si in which a p-type inversion layer is formed, providing a tunnel junction between the source and the channel, so that electrons or holes are injected into the channel by interband tunneling, rather than by the typical conventional mechanism, thermionic emission. The heterojunction material combination is chosen to provide a high tunneling probability by employing a source material that, for a p-channel device, has a conduction band energy close to the energy of the valence band of the channel. A related concept works also for n-channel devices, with the source material selected so that its valence band energy is close to the conduction band energy of the channel material. Potentials are applied to the transistor via a source contact 18, and to a drain 20, preferably made of the same material as the channel (Si in this example) via a drain contact 22. Conduction in the channel 14 is controlled via potential applied to a gate electrode 24 that is isolated by dielectric 26, preferably high K dielectric material 26. High K material is desirable because it provides for a small effective oxide thickness and a resultant large gate capacitance without incurring much gate leakage. The large gate capacitance is conducive to large transconductance and large output currents.

During device operation, electrons tunnel from the valence band of the Si channel 14 and flow into the conduction band of the $SnO_2$ in the source 12. The holes in the Si channel 14 created by the tunneling events flow to the drain 20, as in conventional FETs, and the electrons introduced into the $SnO_2$ source 12 flow to the source contact 18. The application of gate bias to the gate electrode 24 increases current flow because a) it increases the tunneling probability between source 12 and channel 14 through variation of the electric fields at the source channel interface; and b) it changes the fermi level of the channel 14 relative to that of the source 12. Only mechanism (b) operates in conventional MOSFETs and as a result, subthreshold swings are limited to 60 mV/decade in the best of circumstances. By introducing the tunneling effect (a), there is the opportunity to vary the current more rapidly than by thermionic emission alone. By proper choice of the source/channel heterojunction, the energy difference between the source 12 and the channel 14 can be tailored over a wide range of energies. Moreover, this controllable offset between the valence band of the source 12 and the conduction band of the channel 14 allows engineering the tunneling injection without the complications of a small bandgap material (with high intrinsic carrier density); it also provides excellent blocking of carriers that might flow by mechanisms other than tunneling. It is superior to tunneling transistors based entirely in Si, which rely on very high and precise doping levels in order to promote tunneling. These doping levels are hard to introduce into the material, and hard to control. By using the heterojunction design, the tunneling probability (and thus the tunneling current) can be made much larger, with only moderate doping requirements.

In a Si transistor of the invention, the output current can be controlled with very small voltage swings. This enables logic circuits to be made in which the transistor threshold voltage is very low (for example, as low as 0.1-0.2V) and the corresponding power supply voltage is also very low (for example, 0.3-0.5V or lower) in order to reduce the power dissipation of the logic circuit (which varies as the square of the power supply voltage). With conventional transistors, such a low voltage logic circuit would exhibit a large amount of leakage current, because it is difficult to turn the transistors completely off with the available voltage swing. Transistor embodiments of the invention suppress this leakage, and allow successful low voltage operation. These transistors can be used, for example, in CMOS high density logic circuits.

Figure 3:
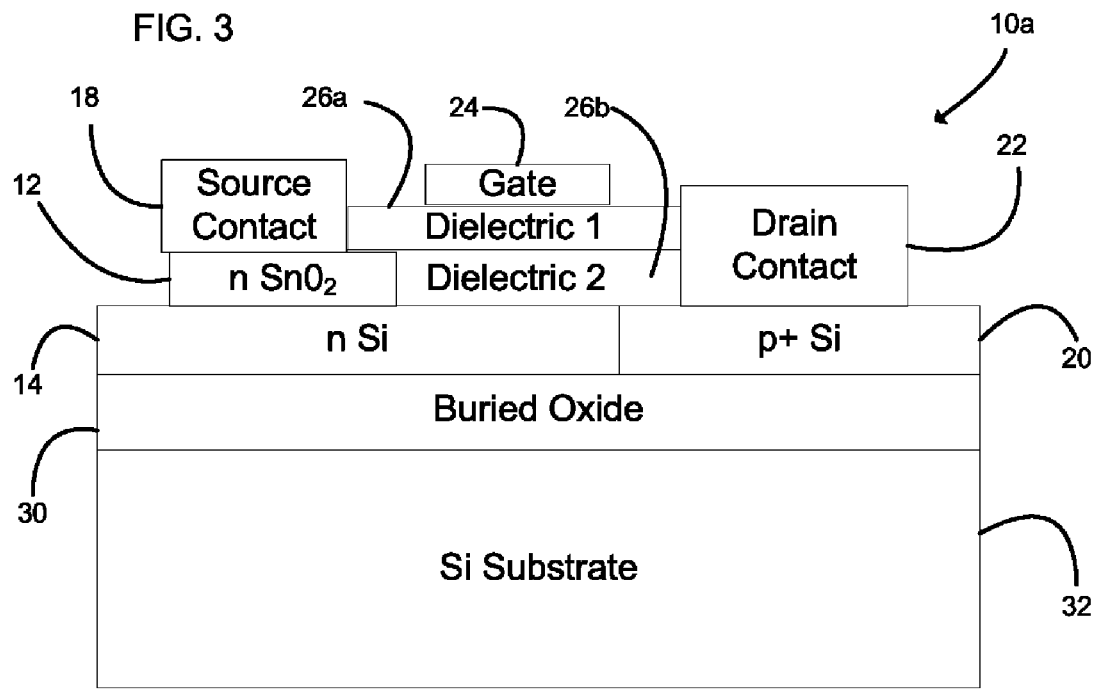
FIG. 3 is a schematic cross-sectional view of a preferred embodiment lateral channel flow silicon transistor of the invention.

In FIG. 3, a preferred silicon transistor 10a employs an FET structure where current flows laterally through the channel 14 to the drain 20. The $SnO_2$ material of the source 12 (or other suitable source material) is deposited on top of the Si material of the channel 14. Tunnel injection from source 12 to the channel 14 can only occur under the influence of the gate 24 voltage at the edge of the $SnO_2$ source layer 12. The gate 24 is preferably isolated from the channel by first and second dielectric layers 26a and 26b, or a single dielectric layer comprising the union of layers 26a and 26b. A buried oxide (silicon-on-insulator structure) 30 is also preferred, in order to limit leakage currents, with the entire structure preferably being supported by a Si substrate 32. The current flows to the source 12 through the source contact 18. Similarly, current flows out of the drain 20 through a drain contact 22. Artisans will recognize numerous possible variations of this basic lateral structure.

Figure 4:
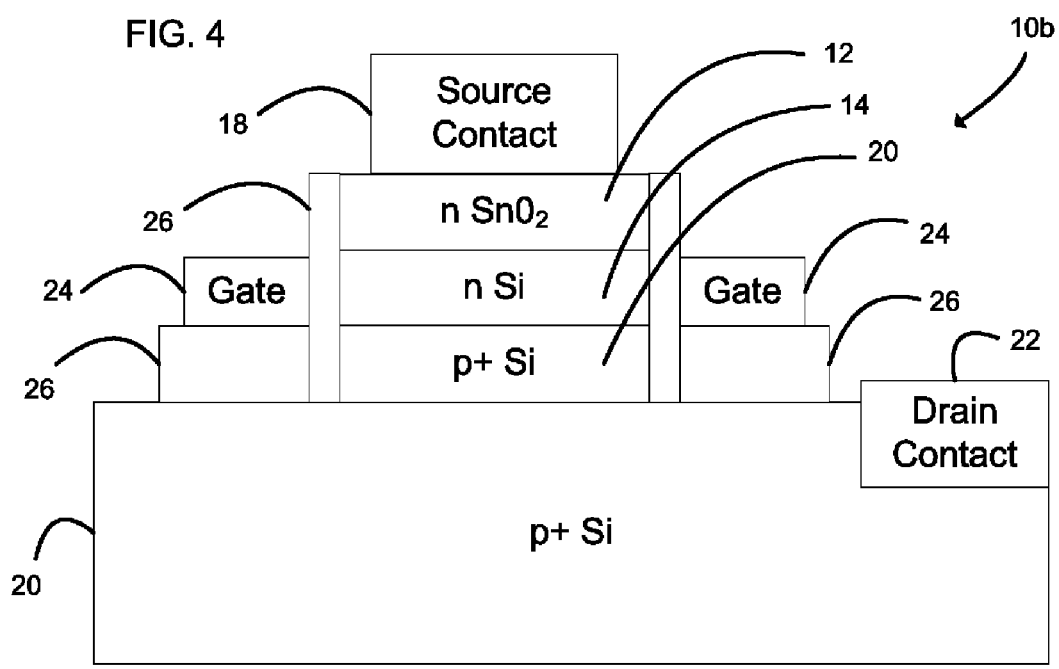
FIG. 4 is a schematic cross-sectional view of a preferred embodiment vertical channel flow silicon transistor of the invention.

FIG. 4 shows a silicon based transistor 10b having a structure that creates vertical current flow through the channel 14 to the drain 20. In the transistor 10b, the gate 24 is deposited on the sides of the FET. This requires appropriate deposition of a spacer 26 separating the gate 24 from drain 22.

The analysis of the device is most straightforward if one assumes that the $SnO_2$ source layer 12 is epitaxially deposited on the Si channel substrate 14. This is hard to achieve due to the large mismatch in lattice constants. Operation is also possible if the $SnO_2$ is polycrystalline. It is important, however, to avoid formation of interface states at the heterojunction between the materials, since this will lead to leakage currents that are thermally activated.

The choice of materials available to form the source of the tunneling FETs on Si is not restricted to $SnO_2$. Generally, the material should be chosen so that its conduction band is at very low energy relative to vacuum (high electron affinity). Materials that fall in this category include $SnO_2$, ZnO, CuO and $WO_2$, among others. The material to be used for the channel and drain is also not unique. Ge is can be used in replace of Si in advanced MOSFETs. The source materials identified here should work with Ge also, whose valence band energy is even higher than that of Si. N-channel devices can also be made following these principles (with $SnO_2$ channel and drain regions, for example, and source composed of p-type Si).

The invention also provides Group III-V MOSFET devices with band lineup characteristics that provide tunneling between the source and channel through variation of the electric fields at the source and channel interface. The tunneling works in conjunction with the change of the Fermi level of the channel relative to the source. Devices of the invention can provide MOSFET operation with lower subthreshold swings due to the tunneling. In MOSFET devices of the invention, injection of carriers from source to channel includes tunneling.

Group III-V tunneling MOSFET transistors of the invention can replace Si-based MOSFETs in CMOS circuits. Example applications of transistors of the invention in logic chips of many types. Particular example applications include computing chips, digital signal processing chips and chips for wireless communications baseband functions. Transistors of the invention are especially advantageous in environments where power dissipation is a critical concern.

A preferred MOSFET device of the invention includes a band lineup of GaSb/InGaAs or AlGaSb/InGaAs and related materials that permits high current density tunneling with the application of small gate voltages. At the same time, their relatively large bandgaps reduce the leakage currents from minority carrier generation that could occur with alternative tunnel structures in small bandgap systems. The devices also benefit from the favorable transport characteristics of electrons in III-V semiconductors (electron mobility above 4000 $cm^2$/Vsec, peak velocity above $3 \times 10^7$ cm/sec), so that high intrinsic device speed is achieved. The reduced subthreshold swing, high output current density (>1000 uA/um) and very low $C\delta V/\delta I$ values that can be expected from the tunneling MOSFETs can enable significant power reductions in high performance circuits.

The III-V materials in a preferred n-channel MOSFET device of the invention are selected to provide a high tunneling probability by employing a source material that, for an n-channel device, has a valence band energy close to the energy of the conduction band of the channel. A preferred n-channel MOSFET uses GaSb or AlGaSb for the p-type source; and InAs or InGaAs for the p-type channel (in which an n-type inversion layer is formed) and an n+ drain.

In MOSFET devices of the invention, output current can be controlled with very small voltage swings. This enables logic circuits to be made in which the transistor threshold voltage is very low (for example, as low as 0.1-0.2V) and the corresponding power supply voltage is very low (for example, 0.3-0.5V) in order to reduce the power dissipation of the logic circuit (which varies as the square of the power supply voltage). With conventional transistors, such a low voltage logic circuit would exhibit a large amount of leakage current, because it is difficult to turn the transistors completely off with the available voltage swing. The Group III-V tunneling transistor suppresses this leakage, and allows successful low voltage operation.

Figure 5:
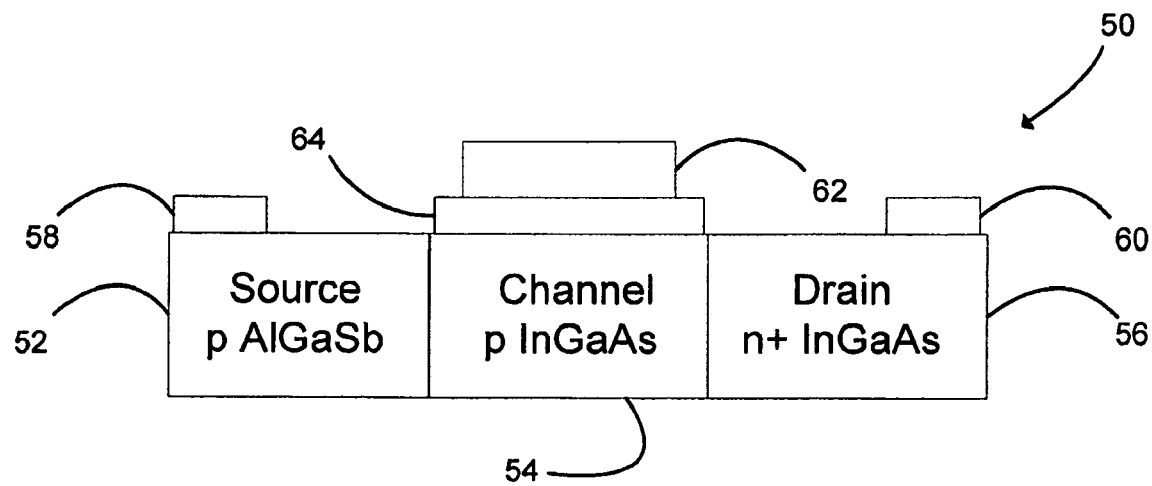
FIG. 5 is a conceptual diagram of a Group III-V transistor of the invention.
Figure 6:
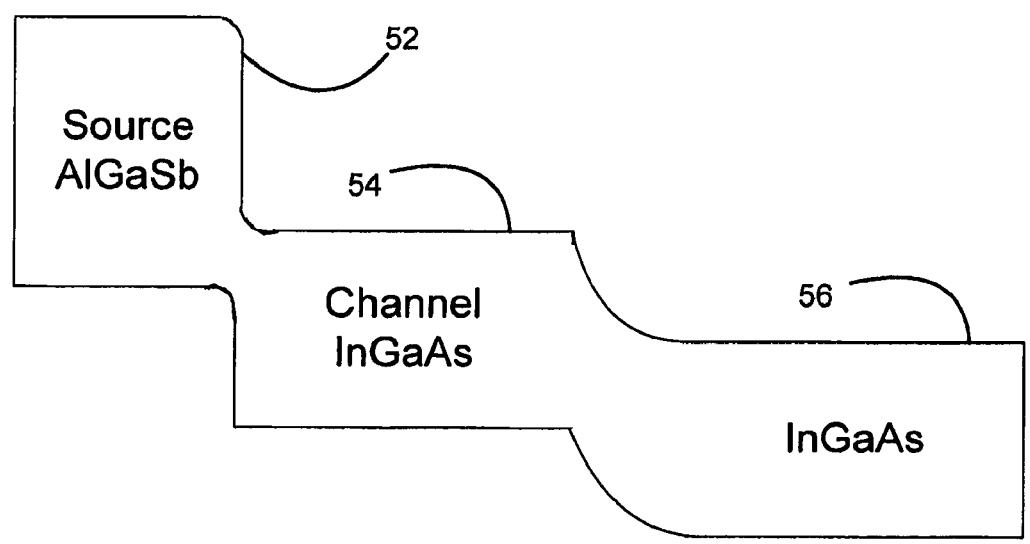
FIG. 6 is a band diagram of the FIG. 5 transistor.

A conceptual diagram of Group III-V material transistor 50 is shown in FIG. 5, and the corresponding approximate band diagram along channel for zero bias condition is shown in FIG. 6. The transistor 50 has a source 52 made of n-type AlGaSb, a channel 54 made of p-type InGaAs, and a drain 56 made of p-type InGaAs. As with the silicon channel embodiments, the source 52 has a source contact 58 and the drain 56 has a drain contact 60. A gate 62 is preferably isolated by a high K dielectric material 64 including for example $Al_2O_3$, $HfO_2$, and Gd/Ga oxide.

Figure 7:
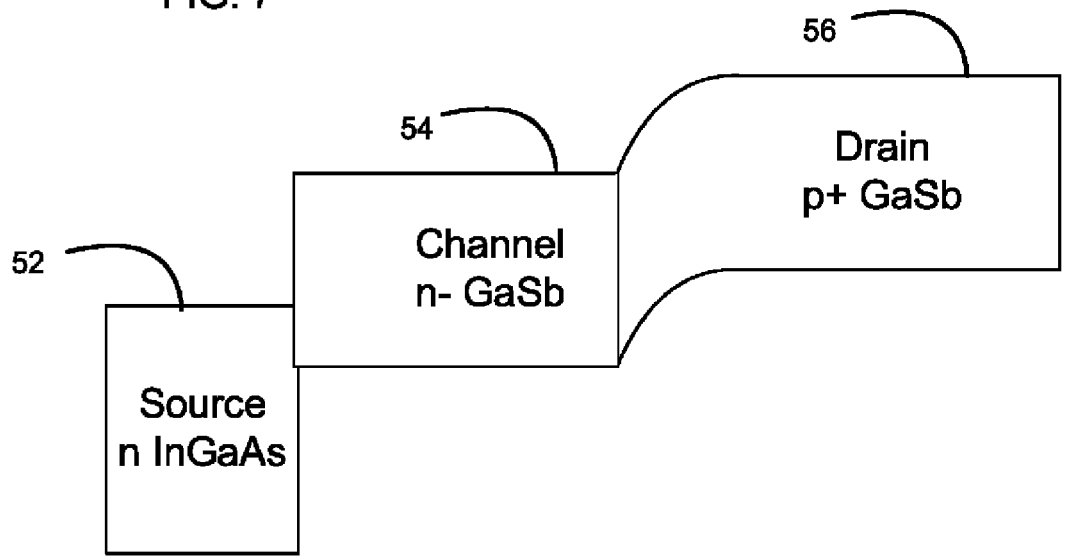
FIG. 7 is a band diagram of another preferred embodiment transistor of the invention.

Additional embodiments include p-channel devices with a corollary band line-up that creates tunneling to provide injection of carriers in the channel. Representative materials, and a representative band diagram along the channel, are shown in FIG. 7.

Figure 8:
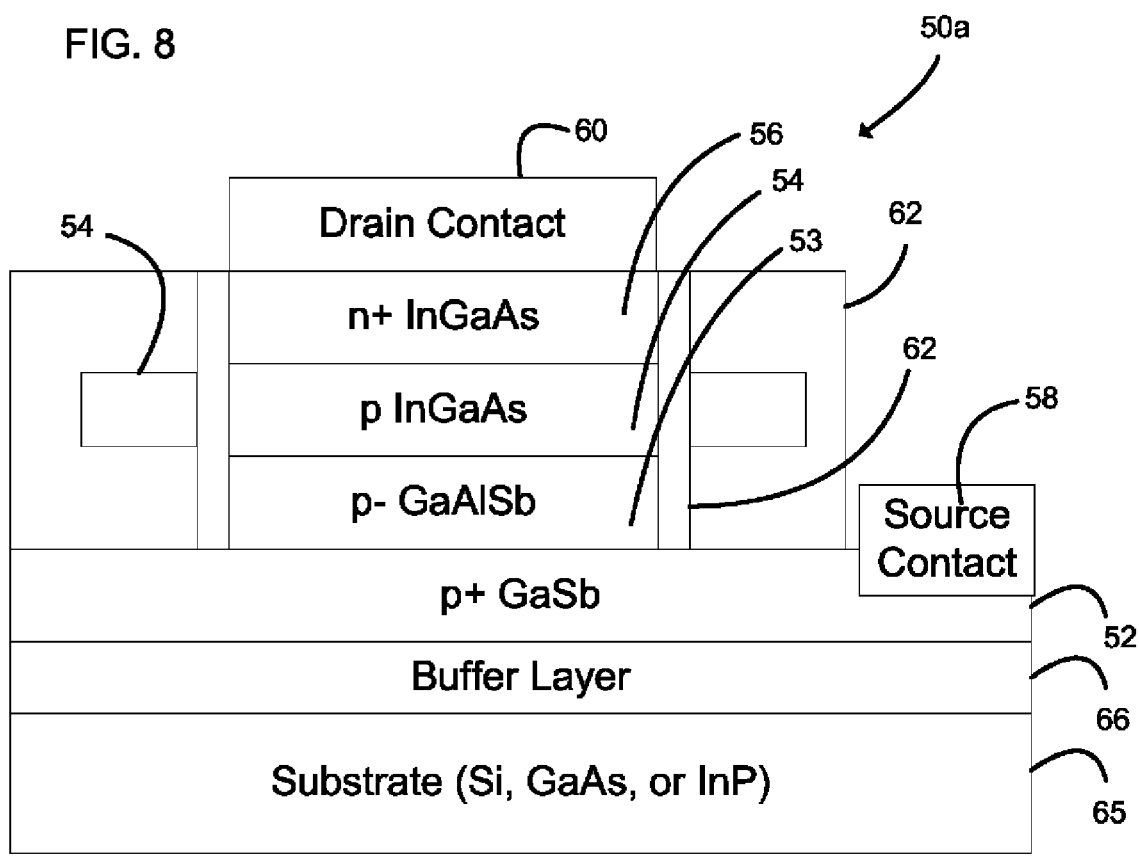
FIG. 8 is a schematic cross section of a preferred embodiment Group III-V transistor of the invention.

FIG. 8 shows a particular preferred embodiment 50a based upon on vertical current flow through the channel 54 to the drain 56. The channel 54 and drain 56 of the transistor are implemented with InGaAs, which typically leads to very high electron mobility (>4000 $cm^2$/Vsec), as well as high ballistic or saturated velocity (>3×$10^7$ cm/sec). The source 52 is implemented with GaAlSb p-type material. During device operation, electrons tunnel from the valence band of the GaAlSb into the conduction band of the InGaAs (and the holes created in the GaAsSb by the tunneling events, flow to the source contact 58). A drain contact 60 is also connected to the InGaAs material in the drain 56. The application of the gate 64 bias increases current flow because a) it increases the tunneling probability between source 52 and channel 54 through variation of the electric fields at the source channel interface; and b) it changes the fermi level of the channel relative to that of the source. Introducing the tunneling effect provides the opportunity to vary the current more rapidly than by thermionic emission alone. By proper choice of material composition, the energy difference between the GaAlSb source 52 and the InGaAs channel 54 can be tailored to virtually any value (positive or negative). Moreover, this controllable offset between valence band of the source 52 and the conduction band of the channel 54 allows engineering the tunneling injection without the complications of a small bandgap material (with high intrinsic carrier density); it also provides excellent blocking of carriers that might flow by mechanisms other than tunneling. The source 52, channel 54, and drain 56 are supported by a Si substrate 65 that is isolated by a buffer layer 66. Artisans will recognize numerous possible variations of this basic lateral structure.

Figure 9:
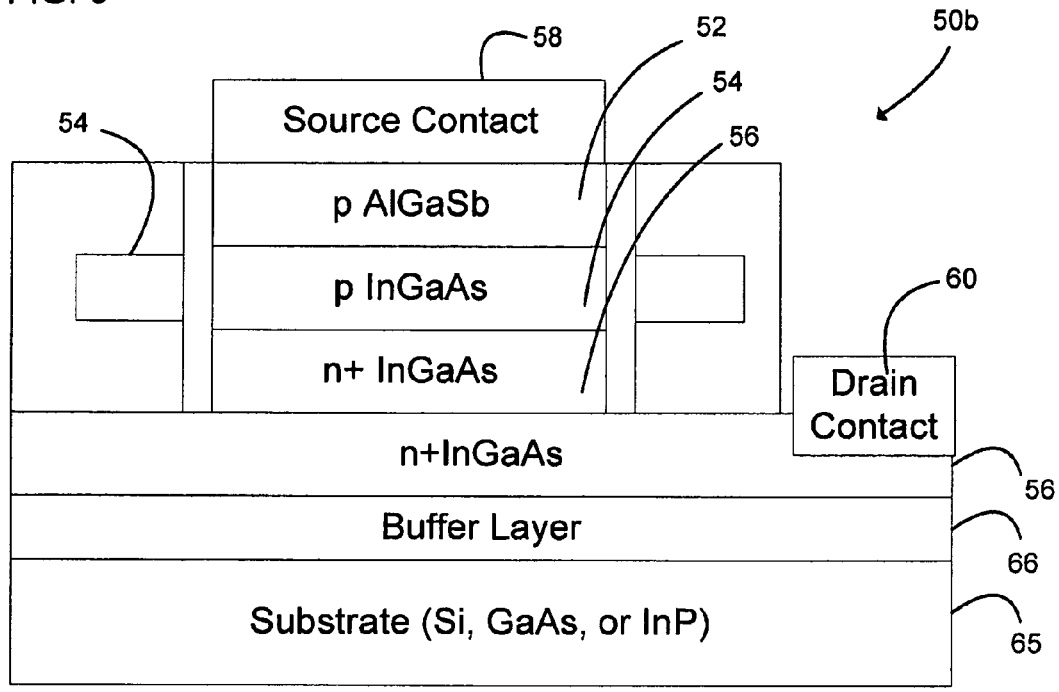
FIG. 9 is a schematic cross-sectional view of another preferred embodiment Group III-V transistor of the invention.

FIG. 9 shows an additional preferred embodiment vertical current flow transistor 50b. The transistor 50b is simlar to the transistor 50a, but notably, the source contact 58 and drain contact 60 are swapped. Further, the source 52 material is made of GaSb and the material in the channel 54 and drain the 56 is made of InGaAs. In this embodiment, the drain 56 has two layers, each made of the same material.

Figure 10:
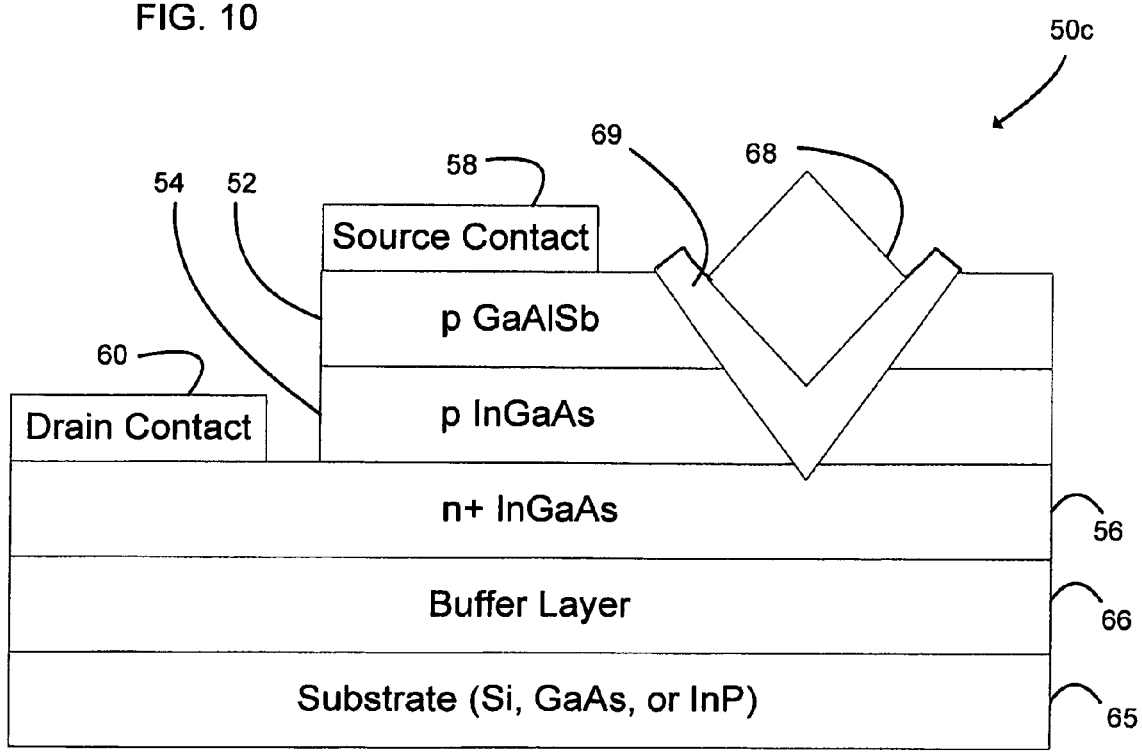
FIG. 10 is a schematic cross-sectional view of another preferred embodiment Group III-V transistor of the invention.

FIG. 10 shows another preferred embodiment vertical current flow transistor 50c of the invention that is based on a gate 68 implemented using etching grooves into appropriate epitaxial layer structures, as shown in FIG. 9. This provides a relatively simple strcutrue to fabricate. Preferably, the gate 68 is supported by a dielectric material 59. P-channel devices can also be made following these principles (with GaSb channel and drain regions).

Figure 11:
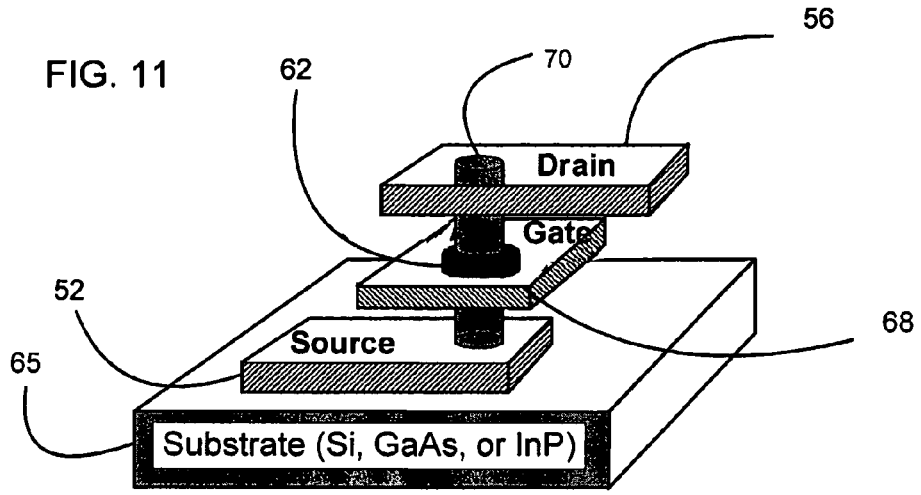
FIG. 11 is schematic perspective view of another preferred embodiment silicon transistor of the invention.

FIG. 11 shows another preferred embodiment transistor that is based on pillar or nanowire-type structures, grown vertically on Si or alternative substrates as shown in FIG. 10. The source 52, gate 68, and drain 56 layers are connected by a nanowire structure channel 70. The materials for the layers are as in FIGS. 8-10.

Figure 12:
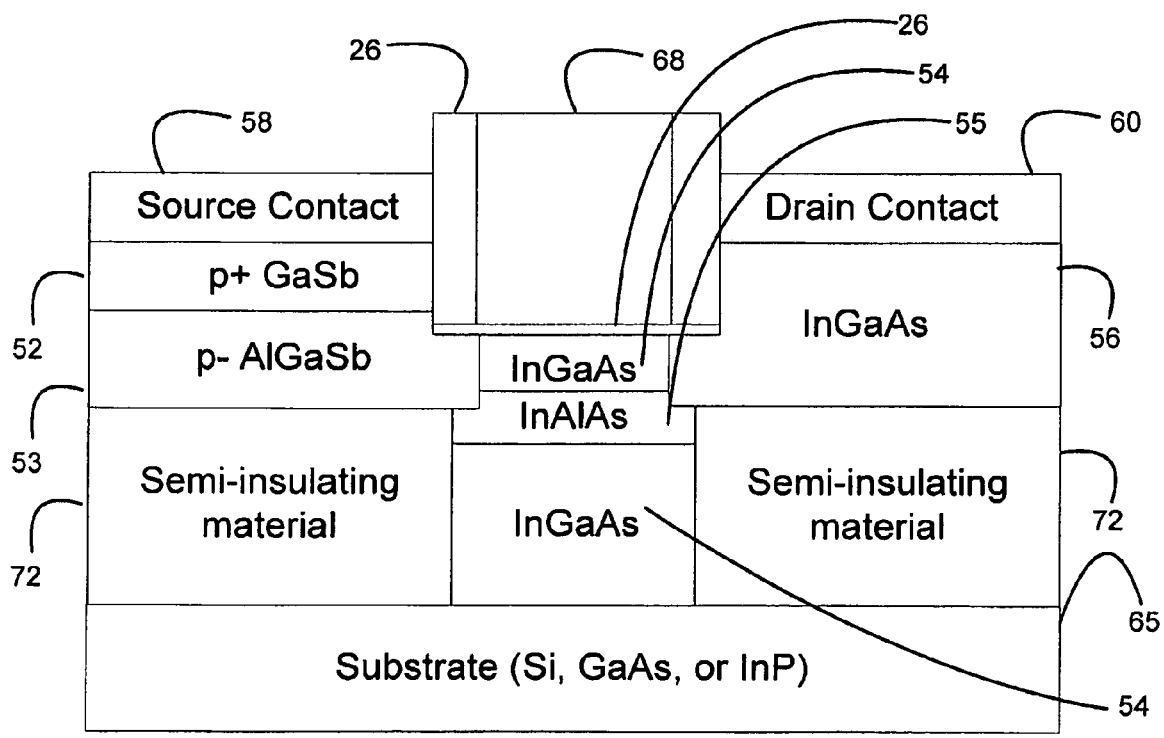
FIG. 12 is schematic cross-sectional view of another preferred embodiment silicon transistor of the invention.

FIG. 12 shows another preferred embodiment that is based on a nearly planar structure. In this structure, epitaxial growth can be carried out to form the channel material, and an optimized deposition technology can be used to deposit the gate dielectric. Subsequently epitaxial growth can be used to create a source region that is composed of a different material from that of the channel or drain. Another epitaxial regrowth step can be used to the drain region. The materials for the layers are as in FIGS. 8-10. In this example, a sub channel 55 separates two channel layers 54. In addition, a semi-insulating material 72 supports the source 52, sub source 53, and drain layers 56.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A transistor comprising:
   a substrate;
   a structure supported by said substrate including a source, drain, gate, and channel, wherein said source and said channel are made of different materials, and said source and said drain are made of different materials; and
   a tunnel junction formed between said source and said channel, whereby said tunnel junction is configured for injecting carriers from said source to said channel via interband tunneling between valence and conduction bands of the source and the channel and wherein a valence band of one of said source and said channel has a staggered band offset of energy in the range of 0 to 0.3 eV with the conduction band of the other one of said source and said channel.

2. The transistor of claim 1 wherein said source, said drain, and said channel are layered vertically on said substrate.

3. The transistor of claim 1 wherein said source, said drain, and said channel are layered laterally along said substrate.

4. The transistor of claim 1 wherein said substrate includes a buffer layer.

5. The transistor of claim 1 wherein a heterojunction is formed between said source and said channel.

6. The transistor of claim 1, wherein said drain and said channel are formed from the same material and are doped such that said channel is doped p or n and said drain is heavily doped p or n.

7. A transistor comprising:
   a substrate;
   a structure formed on said substrate including a source, drain, gate and channel, wherein said source and said channel are made of different Group III-V materials, and said source and said drain are made of different materials, with a valence band of one of the source and the channel having an energy level in the range of 0 to 0.3 eV to the conduction band of the other one of said source and said channel.

8. The transistor of claim 7 wherein said transistor is an n-channel transistor and said source is made of GaAlSb material and said channel is made of InGaAs or InAs material.

9. The transistor of claim 7 wherein said source, said, drain, said gate, and said channel are layered vertically on said substrate.

10. The transistor of claim 9 wherein said channel comprises a nanowire.

11. The transistor of claim 7 wherein said source, said drain, said gate, and said channel are layered laterally along said substrate.

12. The transistor of claim 7 wherein the material of said source is chosen so that its valence band energy has a properly tailored difference in the range of 0 to 0.3 eV relative to the conduction band energy of the material of said channel and said channel comprises a channel for electron current.

13. The transistor of claim 7 wherein the material of said source is chosen so that its conduction band energy has a properly tailored difference in the range of 0 to 0.3 eV relative to the valence band energy of the material of said channel and said channel comprises a channel for hole current.

14. The transistor of claim 7 wherein said gate is implemented using etching grooves in said structures and wherein a high-k dielectric stack is contained within said grooves.

15. The transistor of claim 7, wherein said transistor is a p-channel transistor and wherein said source is made of InGaAs or InAs material and said channel is made of GaAlSb material.

16. The transistor of claim 7, where said transistor is an n-channel transistor and wherein said source is made of GaSb or AlGASb and said channel is made of InAs or InGaAs.

17. The transistor of claim 7, wherein said drain and said channel are formed from the same material and are doped differently such that said channel is doped p or n and said drain is heavily doped p or n.

18. A low voltage transistor, comprising:
a substrate;
a source, drain, gate and channel structure having said source and said channel made of different materials, and having said source and said drain made of different materials, said structure formed on said substrate including means for injecting carriers into the channel by tunneling such that gate bias increases the interband tunneling probability between source and channel through variation of the electric fields at the source channel interface and wherein a valence band of one of said source and said channel has a staggered band offset of energy in the range of 0 to 0.3 eV with the conduction band of the other one of said source and said channel.

19. The transistor of claim 18, wherein said a source, drain, gate and channel structure comprises an arrangement of Group III-V materials.

20. The transistor of claim 18, wherein said a source, drain, gate and channel structure comprises a heterojunction between said source and said drain.

21. The transistor of claim 18, wherein said staggered band offset provides for the injection of carriers into the channel under control of said gate, and wherein said transistor has a turn-on rate that is less than 60 mV/decade.

22. The transistor of claim 18, wherein said drain and said channel are formed from the same material and are doped differently such that said channel is doped p or n and said drain is heavily doped p or n.

* * * * *

UNITED STATES PATENT AND TRADEMARK OFFICE
CERTIFICATE OF CORRECTION

PATENT NO. : 8,148,718 B2  Page 1 of 1
APPLICATION NO. : 12/156547
DATED : April 3, 2012
INVENTOR(S) : Peter M. Asbeck et al.

It is certified that error appears in the above-identified patent and that said Letters Patent is hereby corrected as shown below:

Col. 7, line 33    Delete "AIGASb" and insert -- AIGaSb -- therefor.

Signed and Sealed this
Twelfth Day of March, 2013

Teresa Stanek Rea
*Acting Director of the United States Patent and Trademark Office*